United States Patent [19]

Matsumura et al.

[11] Patent Number: 5,427,938
[45] Date of Patent: Jun. 27, 1995

[54] METHOD OF MANUFACTURING A RESIN-SEALED SEMICONDUCTOR DEVICE

[75] Inventors: Tsuneo Matsumura, Shiki; Atsuo Konishi, Kitakatsuragi; Kouji Shirai, Kishiwada, all of Japan

[73] Assignee: Sharp Kabushiki Kaisha, Osaka, Japan

[21] Appl. No.: 185,056

[22] Filed: Jan. 24, 1994

[30] Foreign Application Priority Data

| Jan. 25, 1993 | [JP] | Japan | 5-010012 |
| Jun. 22, 1993 | [JP] | Japan | 5-150405 |
| Dec. 10, 1993 | [JP] | Japan | 5-310883 |

[51] Int. Cl.6 .................................... H01L 21/60
[52] U.S. Cl. .................. 437/217; 437/209; 437/211; 437/214; 437/219
[58] Field of Search ............. 437/209, 211, 212, 213, 437/214, 215, 216, 217, 218, 219, 220

[56] References Cited

U.S. PATENT DOCUMENTS

| 4,451,973 | 6/1984 | Tateno et al. | 437/214 |
| 4,649,637 | 3/1987 | Hatakeyama | 437/217 |
| 4,888,307 | 12/1989 | Spairisano et al. | 437/216 |
| 4,981,776 | 1/1991 | Yoshimura | 437/219 |
| 5,091,341 | 2/1992 | Asada et al. | 437/214 |
| 5,288,667 | 2/1994 | Taruya et al. | 437/217 |

*Primary Examiner*—Kevin M. Picardat

[57] ABSTRACT

A method of manufacturing a resin-sealed semiconductor device includes the steps of: supporting and fixing a supporting plate in a set of molds using a positioning pin with a sharp pin point which is inserted into the molds to have a predetermined clearance from the supporting plate; injecting a sealing resin 11 into a cavity formed in the molds; and removing the positioning pin from the molds after the sealing resin 11 hardens. This method increases the life of the positioning pin, facilitates the removal of a semiconductor device from the molds, and achieves a semiconductor device with good insulation.

20 Claims, 9 Drawing Sheets

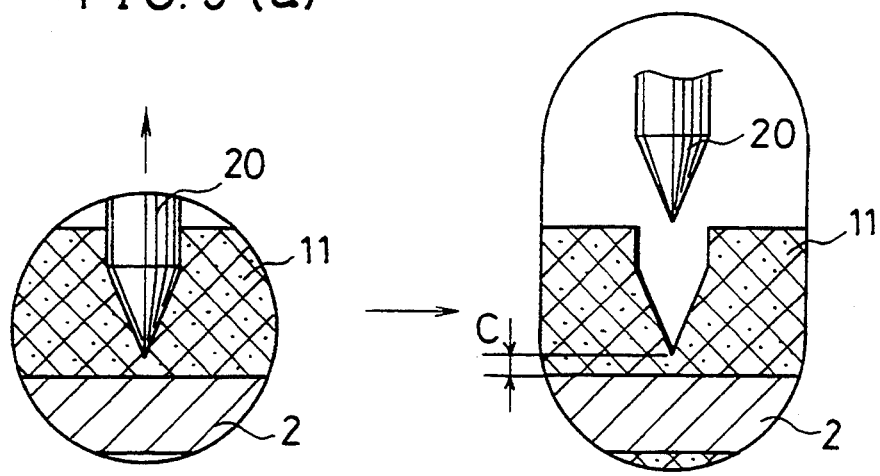
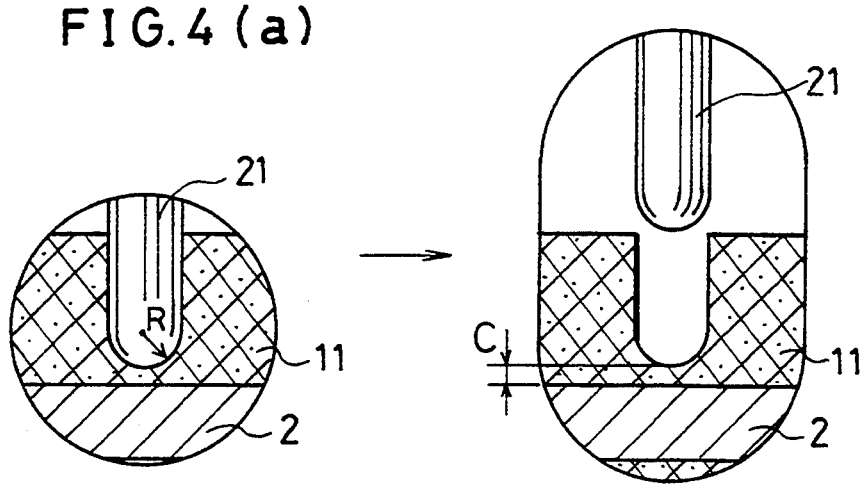

METHOD OF MANUFACTURING A RESIN-SEALED SEMICONDUCTOR DEVICE

FIELD OF THE INVENTION

The present invention relates to a method of manufacturing a resin-sealed semiconductor device, and more particularly relates to a method of fixing a lead frame when sealing a semiconductor device with a resin.

BACKGROUND OF THE INVENTION

In a resin-sealed power semiconductor device (hereinafter just referred to as the semiconductor device), generally, only a front surface of a supporting plate having thereon a semiconductor chip is sealed with a resin. Namely, a rear surface thereof is not sealed with the resin. Therefore, when mounting the semiconductor device on an external radiator, it is necessary to insert an insulation sheet between the rear surface of the semiconductor device and the external radiator, resulting in complicated mounting process.

In order to overcome such inconvenience, a method for sealing the rear surface of the supporting plate is suggested.

As illustrated in FIG. 11, with the resin sealing technique, a semiconductor chip is sealed with a resin using a upper mold 41 and a lower mold 42. More specifically, as illustrated in FIG. 12, a semiconductor chip 45 is electroconductively bonded to a supporting plate 44 as a part of a lead frame 43. The electrodes of the semiconductor chip 45 are connected to external lead terminals 43a with bonding wires 49, respectively.

Then, as illustrated in FIG. 11, the supporting plate 44 is placed in a cavity 46 in the molds 41 and 42, and a sealing resin (for example, epoxy resin or polyimide resin) 47 is injected into the cavity 46. At this time, in order to stop the supporting plate 44 from moving in the cavity 46, the external lead terminals 43a connected to a side edge of the supporting plate 44 and a bar 48 connecting parts of the supporting plate 44 to each other are sandwiched between the molds 41 and 42.

After the sealing resin 47 hardens, the resin-sealed lead frame 43 is removed from the molds 41 and 42 as shown in FIG. 13. Then, by cutting off unnecessary parts of the lead frame 43 such as the bar 48 and a tie bar 43b, a resin-sealed semiconductor device is obtained as shown in FIG. 14.

However, with this method, the external lead terminals 43a of the lead frame 43 are held between the molds 41 and 42 so as to stop the supporting plate 44 from moving when the resin is injected into the cavity 46. After sealing the supporting plate 44 with the resin, the bar 48 protrudes from the resin-sealed section. As described above, after removing the lead frame 43 from the molds 41 and 42, the bar 48 is cut off. Cut sections 50 appear on the front surface of the hardened sealing resin 47.

The cut sections 50 are removed by, for example, chemical etching. However, such an additional etching process increases the manufacturing cost. It is hard to say that performing a desired etching at a rate of mass production is practical. Thus, this method lowers the mass productivity of the semiconductor device.

Alternatively, a method which requires no etching process by supporting and fixing a part of the supporting plate in the molds with a positioning pin is suggested. With this method, an upper mold 51 and a lower mold 52 shown in FIGS. 15(a) and 15(b) are used.

The molds 51 and 52 have movable positioning pins 59 which are allowed to protrude into a cavity 56. A resin filling opening 60 is formed in a part of the contact section of the molds 51 and 52. Unlike the above-mentioned method, with this method, since the lead frame 53 is fixed by the movable positioning pins 59, there is no need to provide a bar on an edge of the lead frame. Thus, every part other than external lead terminals 53a is fully sealed with a resin.

With this method, firstly, as illustrated in FIG. 16, a semiconductor chip 55 is electrically bonded onto a supporting plate 54 as a part of the lead frame 53. The electrodes of the semiconductor chip 55 and external lead terminals 53a are also electrically connected with bonding wires 58. Next, as illustrated in FIGS. 15(a) and 15(b), the lead frame 53 is placed in a cavity 56 between the molds 51 and 52, and the external lead terminals 53a are sandwiched between the molds 51 and 52. An edge of the supporting plate 54 is fixed and supported by the movable positioning pins 59 which are inserted from the molds 51 and 52 into the cavity 56, and a sealing resin 57 is injected into the cavity 56 through a resin filling opening 60.

As illustrated in FIGS. 17(a) and 17(b), before the sealing resin 57 hardens, the movable positioning pins 59 are pulled until their pin points reach the surface of a molding (the inner faces of the molds 51 and 52), and the sealing resin 57 is again injected into the cavity 56 to fill up the portions which were occupied by the movable positioning pins 59. After the sealing resin 57 hardens, the lead frame 53 is removed from the molds 51 and 52. Then, unnecessary parts such as the tie bar 53b are cut off to obtain a semiconductor device shown in FIG. 18.

With this method, by pulling out the movable positioning pins 59 before the sealing resin 57 hardens, the contact section 54a (see FIG. 19) on the front surface of the supporting plate 54, which is in contact with the pin points of the movable positioning pins 59, is covered with the sealing resin 57. Accordingly, it is possible to fully cover the supporting plate 54 with the sealing resin 57, and thereby improving the insulation of the semiconductor device.

However, the pin points of the movable positioning pins 59 used for supporting and fixing the lead frame 53 in the molds 51 and 52 are abraded by a filament contained in the sealing resin 57 (because a large amount of filaments of high thermal conductivity are contained in a sealing resin used for manufacturing a power semiconductor device as the resin is required to have high heat diffusion rate).

If the pin points of the movable positioning pins 59 are abraded and their shapes shown by the broken lines are changed to the ones shown by the solid lines due to the reason mentioned above, the following cases emerge. If the movable positioning pins 59 are lifted to the surface of a molding when the sealing resin 57 hardens to a half degree, the sealing resin 57 flows into a clearance between the upper mold 51 and the movable positioning pins 59 as shown in FIG. 20. As a result, a vertical burrs are formed on the surface of the molding, spoiling the appearance of the molding. Such vertical burrs make it difficult to remove the molding from the molds 51 and 52, and shorten the life of the molds 51 and 52. Therefore, replacing the positioning pins is required as soon as the positioning pins are abraded.

On the other hand, when the movable positioning pins 59 are pulled out after the sealing resin 57 hardens, even if the positioning pins 59 are abraded, it is possible to prevent the flow of the sealing resin 57 from forming the vertical burrs. In this case, however, it is impossible to have an exposed portion preventing effect which is produced by pulling out the movable positioning pins 59 when the sealing resin 57 hardens to a half degree. Consequently, the contact section 54a of the supporting plate 54 where the movable positioning pins 59 are in contact with the supporting plate 54 remains exposed, deteriorating the insulation of the product.

SUMMARY OF THE INVENTION

It is an object of the present invention to provide a method of manufacturing a semiconductor device having good insulation while increasing the life of a positioning pin and facilitating the removal of the semiconductor device from molds by preventing vertical burrs.

In order to achieve the above object, a method of manufacturing a resin-sealed semiconductor device of the present invention at least includes the following three steps.

(1) Placing a lead frame having a semiconductor chip mounted thereon between an upper mold and a lower mold, and sandwiching a part of the lead frame between the upper and lower molds.

(2) Locating the lead frame in position by inserting a positioning pin having a reduced cross section toward a pin point into the molds.

(3) Sealing the lead frame by injecting a resin into the molds and by hardening the resin while keeping the positioning pin inserted into the molds.

With this method, the positioning pin used for placing the lead frame in position in the molds is formed to have a reduced cross section toward the pin point, for example, to have a sharp or semi-spherical pin point. Moreover, since the resin hardens when the positioning pin is inserted into the molds, burrs can never be produced on the surface of a molding even if the positioning pin has an abraded pin point. It is therefore possible to prevent the appearance of the product from being spoiled and the removal of the product from the molds from becoming difficult. Furthermore, since it is possible to use an abraded positioning pin, the life of the positioning pin is increased.

In addition, by performing the positioning of the lead frame with such a positioning pin, there is no need to perform an additional process such as an etching process after molding, achieving a reduction in the manufacturing cost. This method also facilitates the removal of the positioning pin from the hardened resin because the positioning pin is produced to have the above-mentioned shaped pin point.

For example, if the resin is hardened while bringing the pin point of the positioning pin and the lead frame into contact with each other, a portion of a surface of the lead frame with which the pin point of the positioning pin made contact is exposed as it is not covered with the resin. However, since the cross section of the pint point is smaller than that of the pin point of a conventional positioning pin, the area of the exposed portion of the lead frame is reduced. Thus, even when the resin hardens when the positioning pin and the lead frame are in contact with each other, a semiconductor device with good insulation is obtained.

Moreover, if a small clearance is produced between the pin point of the positioning pin and the lead frame, it is possible to completely cover the surface of the lead frame with the resin. As a result, the insulation of a semiconductor device is improved.

It is also possible to achieve the above object by using a method of manufacturing a resin-sealed semiconductor device of the present invention including at least the following four steps.

(1) Placing a lead frame having a semiconductor chip mounted thereon between an upper mold and a lower mold and sandwiching a part of the lead frame between the upper and lower molds.

(2) Inserting a positioning pin from either the upper or lower mold.

(3) Injecting a resin to push the lead frame in a direction which is opposite to a direction toward which the positioning pin is inserted in the molds.

(4) Sealing the lead frame by hardening the resin while locating the lead frame in position with injection pressure of the resin and the positioning pin.

With this method, the positioning of the lead frame in the molds is performed using the positioning pin inserted either from the upper or lower mold and the injection pressure of the injected resin which pushes the lead frame in a direction opposite the direction toward which the positioning pin is inserted. Therefore, like the above-mentioned method, an additional process such as etching is not required, and the manufacturing cost is reduced. Moreover, since the positioning pin is inserted only from one of the molds, a surface of the lead frame facing the other mold through which the positioning pin is not inserted is completely covered with the resin, giving good insulation. With this method, it is also possible to prevent burrs from being produced.

For example, if the positioning pin is inserted from the upper mold, the rear surface of the lead frame facing the lower mold is completely sealed with the resin. Therefore, when mounting the rear surface of the lead frame to an external radiator, it is possible to have a sufficient distance between the external radiator and the rear surface of the lead frame. Consequently, the semiconductor device having insulation similar to that of a conventional completely resin-sealed semiconductor device is obtained.

Furthermore, if a small clearance is produced between the positioning pin inserted into the molds and the lead frame, it is possible to completely cover both the surfaces of the lead frame with the resin. As a result, the insulation of a semiconductor device is improved.

For a fuller understanding of the nature and advantages of the invention, reference should be made to the ensuing detailed description taken in conjunction with the accompanying drawings.

BRIEF DESCRIPTION OF THE DRAWINGS

FIGS. 3(a) and 3(b) are enlarged views of essential part showing the positional relation between a positioning pin having a sharp pin point inserted into the molds and a supporting plate.

FIGS. 4(a) and 4(b) are enlarged views of essential part showing the positional relation between a positioning pin having a semi-spherical pin point inserted into the molds and the supporting plate.

DESCRIPTION OF THE PREFERRED EMBODIMENTS

EMBODIMENT 1

The following description discusses one embodiment of the present invention with reference to FIGS. 1 to 6.

Figure 2:
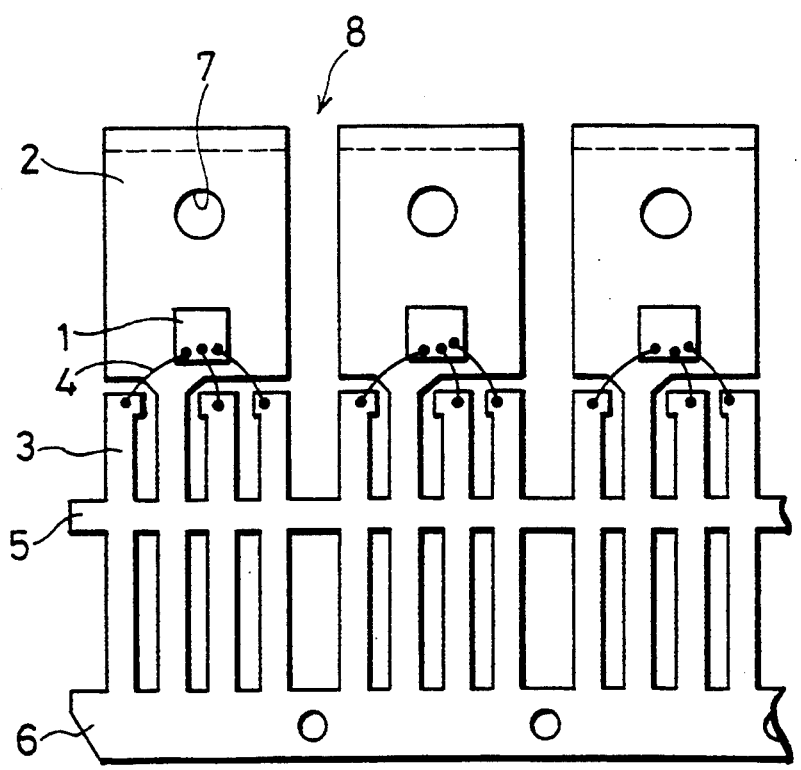
FIG. 2 is a plan view showing the lead frame.
Figure 5:
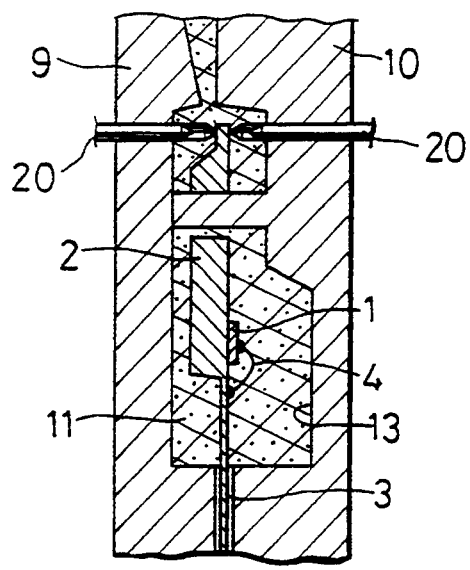
FIG. 5(a) is a vertical section of the set of molds when pulling out the positioning pins.
FIG. 5(b) is a transverse cross section of the set of molds.
Figure 5:
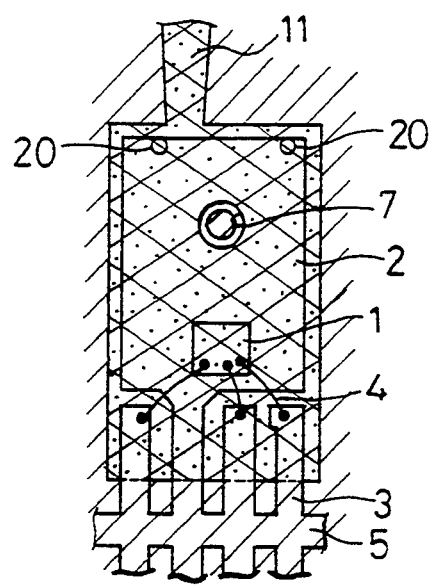
Figure 6:
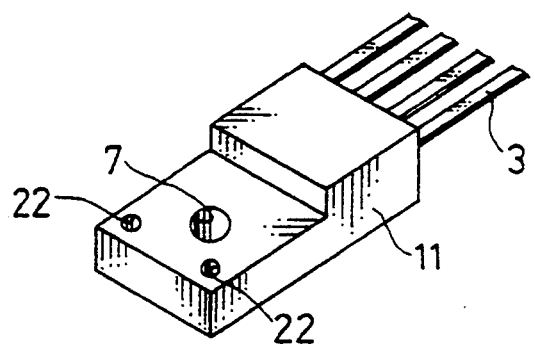
FIG. 6 is a perspective view of a semiconductor device manufactured according to the manufacturing method of the present invention.

When manufacturing a resin-sealed power semiconductor device (hereinafter just referred to as the semiconductor device) by a manufacturing method of this embodiment, a semiconductor chip 1 is first placed on a metallic lead frame 8 shown in FIG. 2. The lead frame 8 includes a supporting plate 2 whereupon the semiconductor chip 1 is placed, and external lead terminals 3 which are electrically connected to the semiconductor chip 1. The external lead terminals 3 are connected to each other with a tie bar 5 and a side frame 6. The supporting plate 2 has avis hole 7 which is used when mounting a finished semiconductor device.

A process of manufacturing the semiconductor device is explained below.

Firstly, the semiconductor chip 1 is electroconductively bonded to the supporting plate 2, and the electrodes of the semiconductor chip 1 are connected to the external lead terminals 3 by bonding wires 4. The lead frame 8 having the semiconductor chip 1 is placed in a lower mold 9 shown in FIGS. 1(a) and 1(b), and the external lead terminals 3 are sandwiched between an upper mold 10 and the lower mold 9. Next, positioning pins 20 are inserted into the molds 9 and 10 to fix one side of the supporting plate 2.

As illustrated in FIG. 3(a), each of the positioning pins 20 has a sharp pin point. Also, as illustrated in FIG. 3(b), a clearance C of, for example, 0.05 to 0.1 mm is produced between the pin points of the positioning pins 20 and the front surface of the supporting plate 2. Namely, the positioning pins 2 do not make contact with the supporting plate 2 in the molds 9 and 10.

However, it is not necessary to make the pin point of each of the positioning pins 20 sharp if its cross section becomes smaller toward the pin point. For example, a positioning pin 21 having a semi-spherical pin point shown in FIGS. 4(a) and 4(b) may be used. In order to facilitate the removal of the positioning pin 21 from the sealing resin 11, R of the pin point is set between 0.5 and 0.6 mm. Moreover, even if the positioning pin 21 is used, there is a need to produce a clearance C of between 0.05 and 0.1 mm between the positioning pin 21 and the front surface of the supporting plate 2.

Figure 1A:
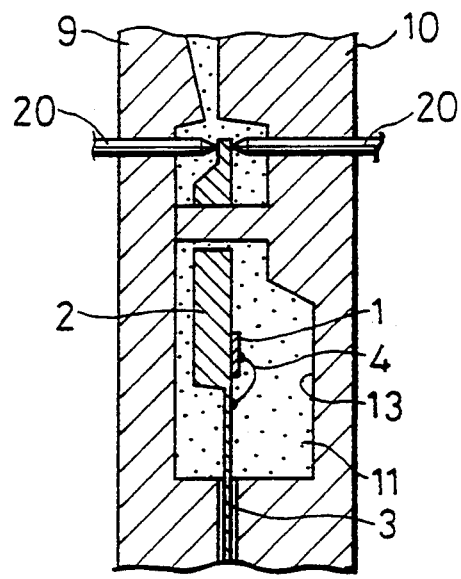
FIG. 1(a) is a vertical section of a set of molds into which a lead frame having a semiconductor chip mounted thereon is placed and a sealing resin is filled according to a manufacturing method relating to one embodiment of the present invention.
Figure 1B:
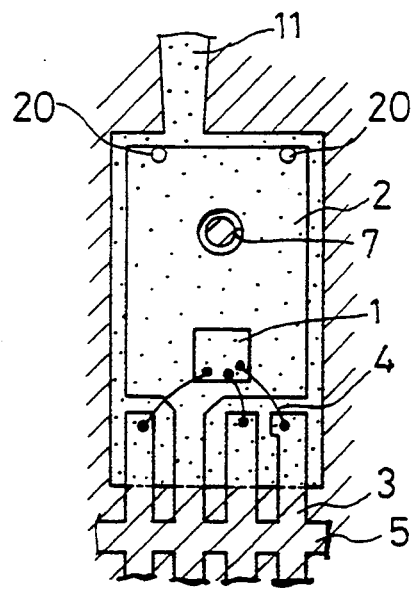
FIG. 1(b) is a transverse cross section of the set of molds shown in FIG. 1(a).

Then, as illustrated in FIG. 1(a), injection-molding is performed according to the transfer mold method by injecting the sealing resin such as an epoxy resin and a polyimide resin into a cavity 13 formed between the molds 9 and 10. At this time, since the clearance is produced between the supporting plate 2 and the positioning pins 20, the supporting plate 2 is moved up or down by the space of the clearance by the pressure of injection. However, since gelatinization of the sealing resin 11 does not start even after the injection of the resin 11 is complete, the supporting plate 2 returns to be level when the lead frame 8 springs back. This causes the sealing resin 11 to flow into the clearance. Subsequently, the sealing resin 11 hardens completely.

After the sealing resin 11 hardens, as illustrated in FIGS. 5(a) and 5(b), the positioning pins 20 are pulled from the molds 9 and 10. Then, the molding is removed from the molds 9 and 10. Next, unnecessary parts of the lead frame 8 such as the tie bar 5 and the side frame 6 are cut off to obtain the semiconductor device shown in FIG. 6. As the positioning pins 20 are inserted until the sealing resin 11 becomes hardened, the semiconductor device has holes 22 on the front surface of the hardened sealing resin 11.

With this method of manufacturing a semiconductor device, the positioning of the lead frame 8 is performed by inserting the positioning pins 20 into the molds 9 and 10. Therefore, a semiconductor device which is completely sealed with a resin except the external lead terminals 3 is obtained. Consequently, an etching process which is required for eliminating an exposed part of the lead frame by a conventional manufacturing method becomes unnecessary. Moreover, since a predetermined clearance is produced between the positioning pins 20 inserted into the molds 9 and 10 and the supporting plate 2, the sealing resin 11 also flows into the clearance. Accordingly, even if the positioning pins 20 are pulled out after the sealing resin 11 hardens, the supporting plate 2 is not exposed, thereby improving the insulation of the semiconductor device.

With a conventional method, if the positioning pins 20 are pulled out before the resin becomes completely hardened, it is not desired to use the positioning pins 20 with abraded pin points because they may produce burrs. On the other hand, with the manufacturing method of this embodiment, since the positioning pins 20 are pulled out after the sealing resin 11 hardens, burrs can never be produced even when the positioning pins 20 have abraded pin points. It is thus possible to prevent the appearance of the product from being spoiled and the removal of the molding from the molds 9 and 10 from becoming difficult while increasing the life of the positioning pins 20.

In this embodiment, the clearance is produced between the positioning pins and the supporting plate. However, with the invention as set forth in claim 1, it is possible to perform injection-molding while bringing the positioning pins having sharp or semi-spherical pin points into contact with the supporting plate without producing the clearance between the positioning pins and the supporting plate. In this case, the resin is made hardened while inserting the positioning pins into the molds. Therefore, burrs are not produced even when the abraded positioning pins are used, and the positioning pins have an increased life. Additionally, since portions of the surface of the supporting plate which are in contact with the pin points of the positioning pins are not covered with the sealing resin, they are exposed if the positioning pins are pulled out after the resin hardens. However, since the positioning pins have sharp or semi-spherical pin points, the area of the exposed portion is minimized. It is therefore possible to manufacture the semiconductor device with insulation which does not cause any practical problems.

EMBODIMENT 2

The following description discusses another embodiment of the present invention with reference to FIGS. 6 to 10. The members having the same function as in the above-mentioned embodiment will be designated by the same code and their description will be omitted.

Figure 7:
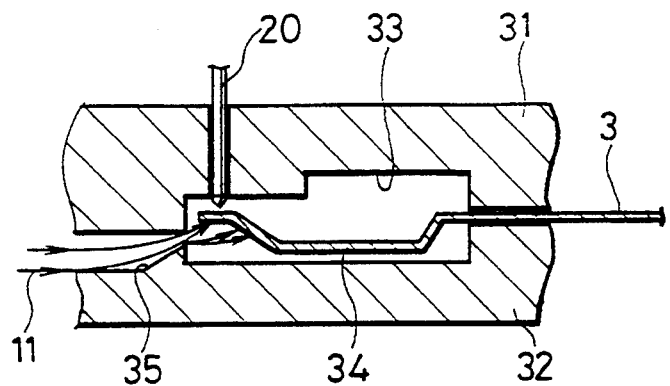
FIG. 7 is a sectional view of the set of molds into which the lead frame having the semiconductor chip mounted thereon is placed according to a manufacturing method relating to another embodiment of the present invention.
Figure 8:
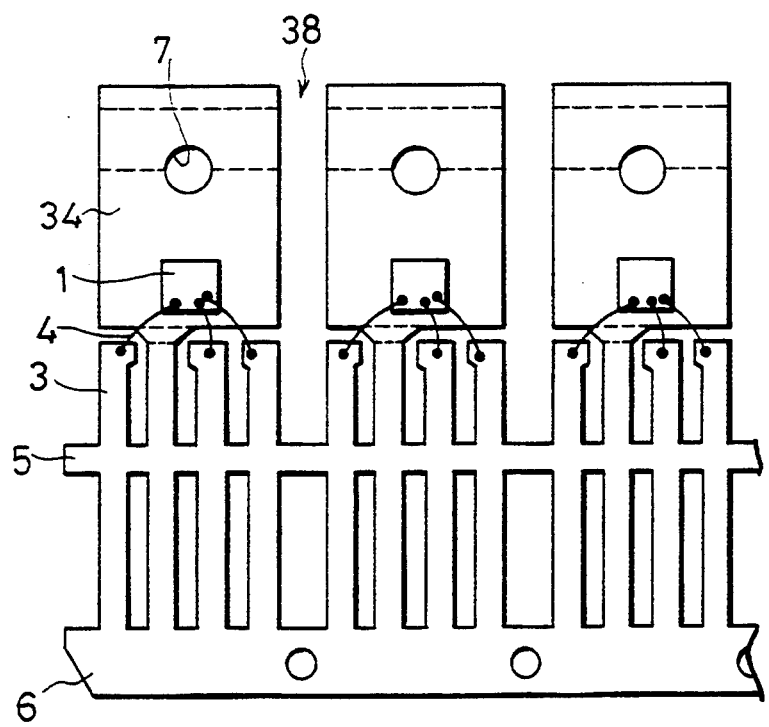
FIG. 8(a) is a plan view of the lead frame shown in FIG. 7.
FIG. 8(b) is a vertical section of the lead frame.
Figure 8:
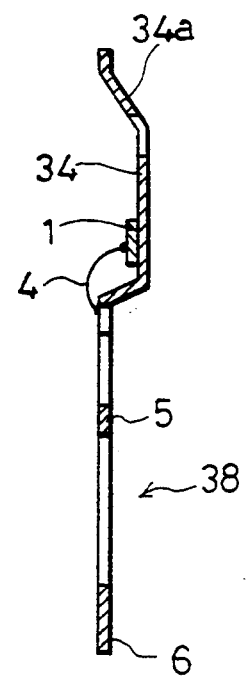

With the manufacturing method of this embodiment, as illustrated in FIG. 7, positioning of a supporting plate 34 in an upper mold 31 and a lower mold 32 is performed using positioning pins 20 which are to be inserted either from the upper mold 31 or the lower mold 32, and injection pressure of the sealing resin 11 injected into a cavity 33 formed between the molds 31 and 32.

Firstly, a semiconductor chip 1 is placed on a supporting plate 34 constituting a lead frame 38 shown in FIG. 8(a), and desired external lead terminals 3 and electrodes of the semiconductor chip 1 are connected to each other with the bonding wires 4. An edge of the lead frame 38 is processed to produce a bent portion 34a as shown in FIG. 8(b) so that the lead frame 38 efficiently receives injection pressure exerted from the down side.

Next, as illustrated in FIG. 7, the lead frame 38 having the semiconductor chip 1 is placed in the lower mold 32, and the external lead terminals 3 are sandwiched between the mold 31 and 32. Then, the positioning pins 20 are inserted from the front surface of the upper mold 31 to restrict the upward movement of the supporting plate 34 in the cavity 33. Like embodiment 1, the positioning pins 20 have sharp pin points, and a predetermined clearance is produced between the positioning pins 20 and the supporting plate 34.

An opening 35 through which the sealing resin 11 is injected into the cavity 33 is formed in a portion which is adjacent to a junction of the molds 31 and 32 and is located on a side opposite to the side where the external lead terminals 3 are sandwiched. A portion of the lower mold 32 where the opening 35 is formed is slanted so that the sealing resin 11 is injected upward, i.e., toward the positioning pins 20.

Then, when the sealing resin 11 is put into the cavity 33 through the opening 35 by the transfer mold method, the sealing resin 11 is injected toward the positioning pins 20. The positioning of the supporting plate 34 is performed using the positioning pins 20 and the injection pressure of the sealing resin 11. At this time, due to the injection pressure of the sealing resin 11, an edge of the supporting plate 34 is moved upward from the predetermined position by the space of the clearance and comes into contact with the positioning pins 20.

However, like embodiment 1, since gelatinization of the sealing resin 11 does not start even after the injection of the sealing resin 11 is complete, the supporting plate 34 returns to be level when the lead frame 38 springs back. This causes the sealing resin 11 to flow into the clearance. After the sealing resin 11 hardens, the positioning pins 20 are pulled out, and the molding is removed from the molds 31 and 32. Next, unnecessary parts of the lead frame 38 such as the tie bar 5 and the side frame 6 are cut off to obtain the semiconductor device shown in FIG. 6.

With the manufacturing method of this embodiment, the positioning of the supporting plate 34 in the cavity 33 is performed using the positioning pins 20 inserted from the mold 31 and the injection pressure of the sealing resin 11. The searing resin 11 is made hardened while inserting the positioning pins 20 into the cavity 33. Similarly to embodiment 1, since an additional process is not required, the manufacturing cost is reduced. Moreover, since the positioning pins 20 are removed after the sealing resin 11 hardens, burrs can never be produced. It is therefore possible to prevent the appearance of the product from being spoiled and the removal of the molding from the molds 9 and 10 from becoming difficult. Furthermore, since the positioning pins 20 having abraded pin points can be used, the life of the positioning pins 20 is increased.

In this embodiment, since the positioning pins are not inserted from the lower mold 32, the rear surface of the supporting plate 34 is completely sealed with the resin. Therefore, when mounting the semiconductor device on an external radiating plate, not shown, the distance between the supporting plate 34 and the external radiating plate becomes long, and thereby surely preventing insulation failure.

In this embodiment, the positioning pins 20 having sharp pin points are inserted into the cavity 33. However, like embodiment 1, even when positioning pins having semi-spherical pin points are used, the same effects are produced. In addition, if the positioning pins with sharp or semi-spherical pin points are used, even when the resin hardens when the supporting plate and the pin points of the positioning pins are in contact with each other in the cavity, the area of an exposed portion of the supporting plate of the finished semiconductor device is minimized. It is therefore possible to manufacture the semiconductor device with insulation which does not cause any practical problems.

Figure 9:
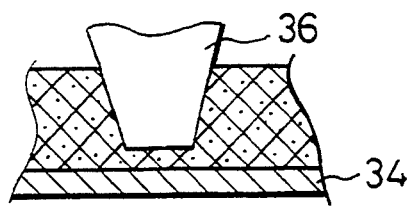
FIG. 9 is an enlarged view of essential part showing the positional relation between the supporting plate of the lead frame and the positioning pin.

Moreover, as illustrated in FIG. 9, even when a positioning pin 36 with a pin point which is not sharp nor semi-spherical is used, if a clearance is produced between the supporting plate 34 and the positioning pin 36, sufficient insulation is achieved because the supporting plate 34 has no exposed portions.

Figure 10:
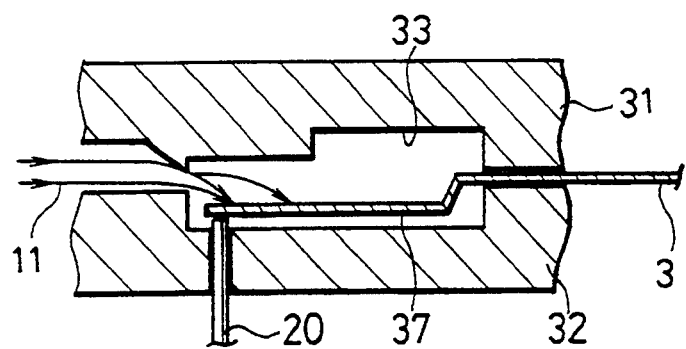
FIG. 10 is a sectional view of the set of molds into which the lead frame having the semiconductor chip mounted thereon is placed according to a manufacturing method relating to still another embodiment of the present invention.
Figure 11:
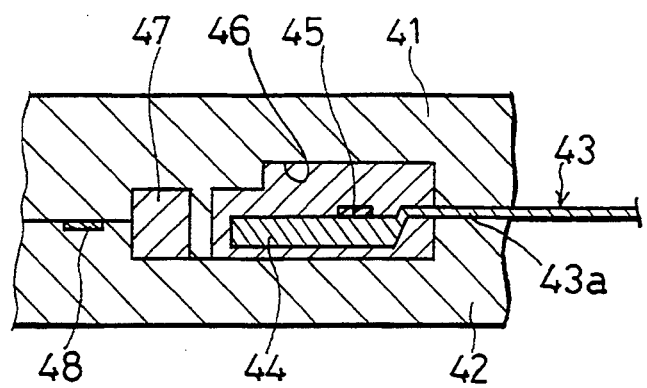
FIG. 11 is a sectional view showing a set of molds into which a lead frame having a semiconductor chip mounted thereon is placed according to a conventional manufacturing method.
Figure 12:
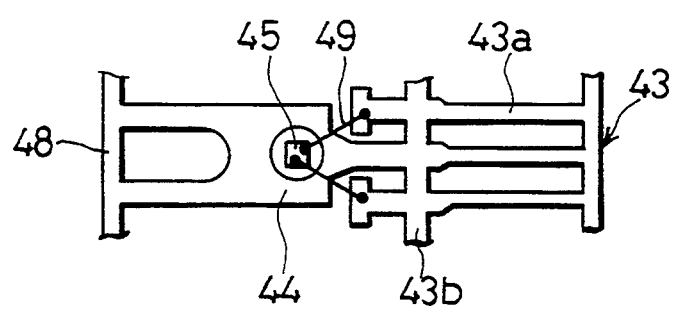
FIG. 12 is a plan view of the lead frame used with the conventional manufacturing method.
Figure 13:
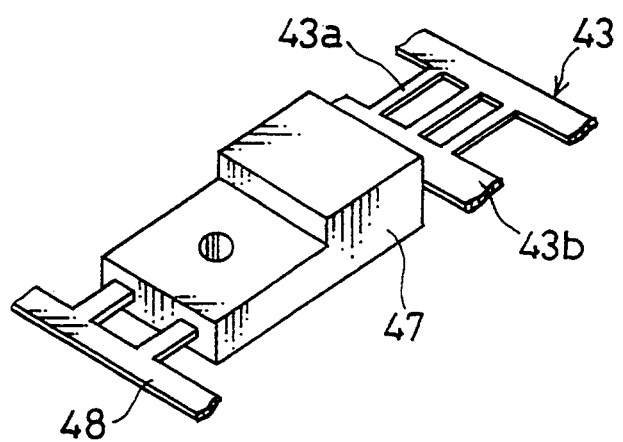
FIG. 13 is a perspective view of the resin-sealed lead frame which is removed from the set of molds according to the conventional manufacturing method.
Figure 14:
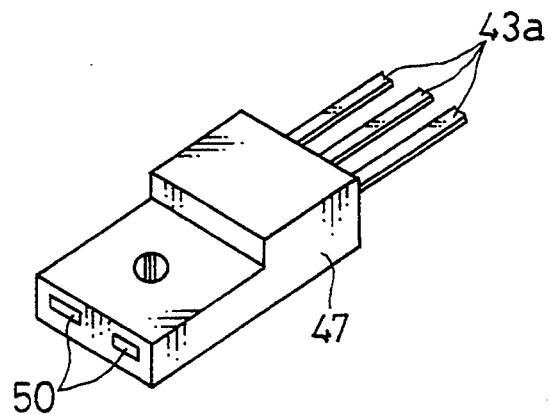
FIG. 14 is a perspective view of a semiconductor device obtained by cutting off unnecessary part of the lead frame of FIG. 13.
Figure 15A:
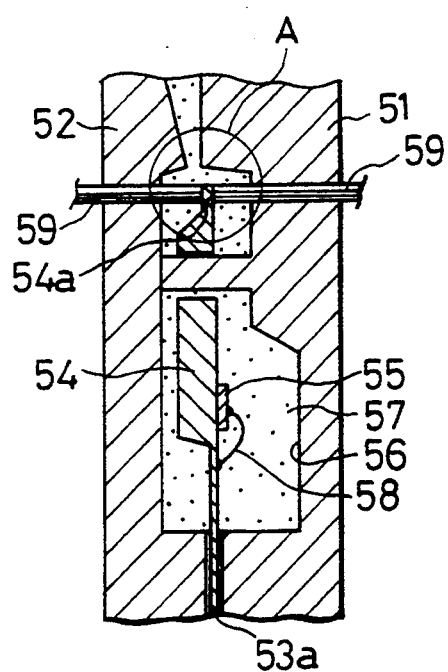
FIG. 15(a) is a vertical section of the set of molds into which the lead frame having the semiconductor chip mounted thereon is placed according to another conventional manufacturing method.
Figure 15B:
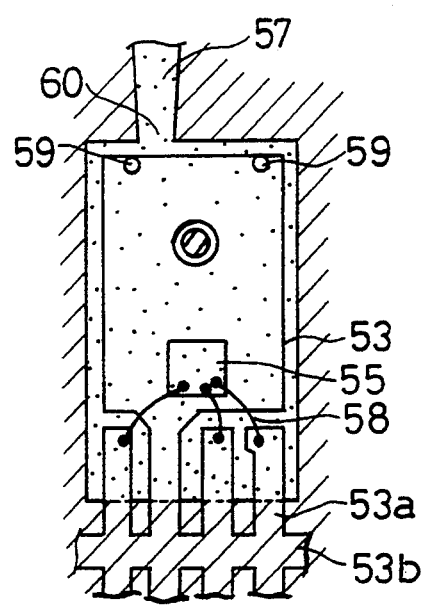
FIG. 15(b) is the transverse cross section of the set of molds.
Figure 16:
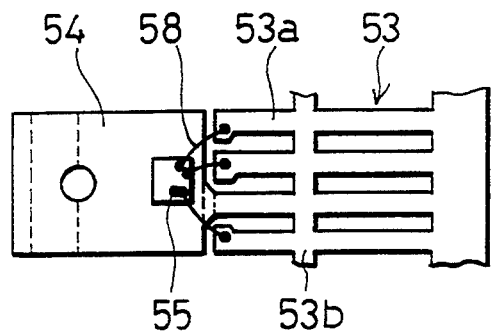
FIG. 16 is a plan view of the lead frame shown in FIGS. 15(a) and 15(b).
Figure 17A:
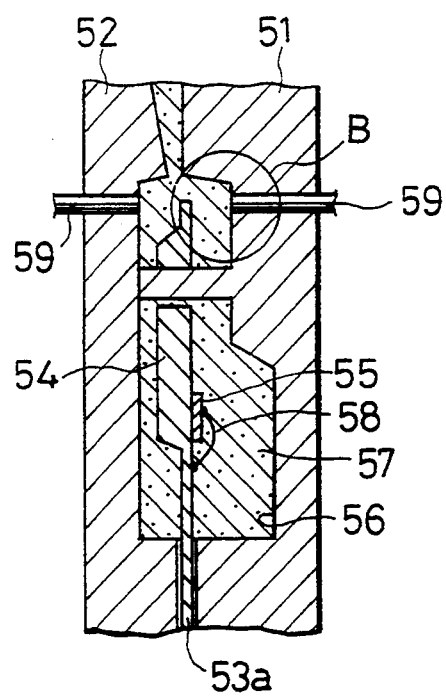
FIG. 17(a) is a vertical section showing the set of molds after pulling the positioning pins from the positions shown in FIGS. 15(a) and 15(b)
Figure 17B:
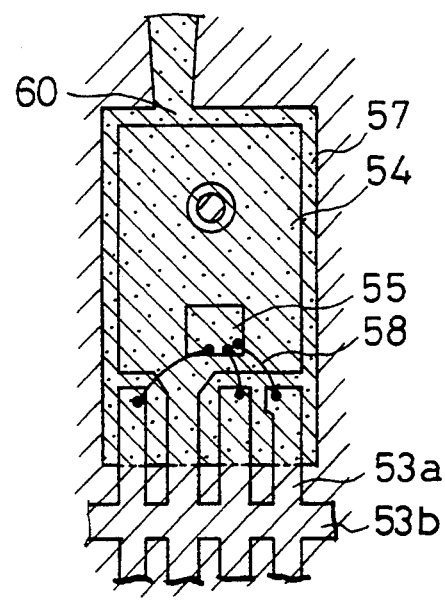
FIG. 17(b) is the transverse cross section of the set of molds.
Figure 18:
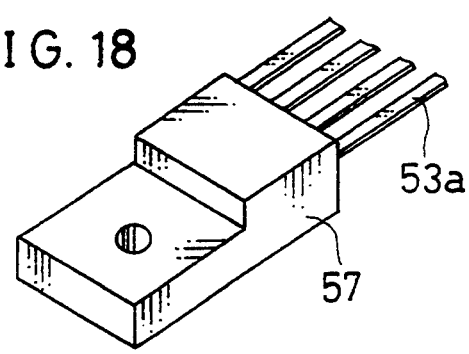
FIG. 18 is perspective view of a semiconductor device removed from the set of molds shown in FIGS. 17(a) and 17(b).
Figure 19:
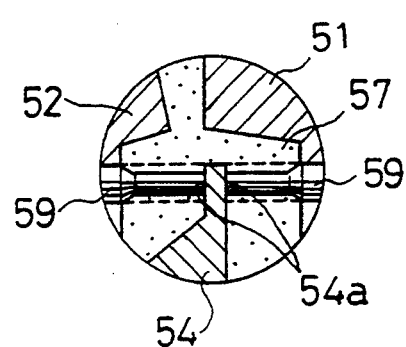
FIG. 19 is an enlarged view of a portion indicated by A in FIG. 15(a).
Figure 20:
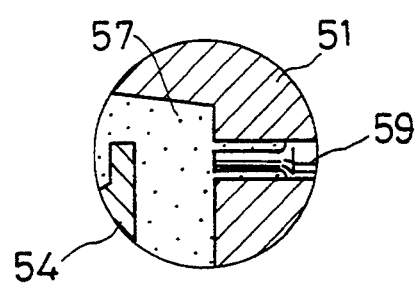
FIG. 20 is an enlarged view of a portion indicated by B in FIG. 17(a).

Furthermore, as illustrated in FIG. 10, it is possible to insert the positioning pins 20 from the lower mold 32 and inject the sealing resin 11 from the upper side of the supporting plate 37. In this case, since the injection pressure of the sealing resin 11 is exerted from the upper side of the supporting plate 37, there is no need to perform the bending processing which is carried out in the above-mentioned embodiment. With this structure, when the sealing resin 11 is injected into the cavity 33, the supporting plate 37 is held in a correct position by the positioning pins 20 and the injection pressure of the sealing resin 11. Then, when the injected sealing resin 11 hardens, a semiconductor device is obtained.

With such a manufacture of the semiconductor device, an additional process such as an etching process is not required, and therefore the manufacturing cost is reduced. It is also possible to achieve a semiconductor device with good insulation, improve the appearance by preventing burrs and the removal of the molding from the set of molds, and to increase the life of the positioning pins.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a resin-sealed semiconductor device comprising the steps of:
   disposing a lead frame having a semiconductor chip mounted thereon between an upper mold and a lower mold and sandwiching a part of said lead frame between said upper and lower molds;
   locating said lead frame in position by inserting a positioning pin having a reduced cross section toward a pin point into said molds;
   sealing said lead frame by injecting a resin into said molds and by hardening said resin while keeping said positioning pin inserted into said molds;
   pulling said positioning pin from said molds after said resin hardens.

2. The method of manufacturing a resin-sealed semiconductor device according to claim 1,
   wherein said positioning pin has a sharp pin point.

3. The method of manufacturing a resin-sealed semiconductor device according to claim 1,
   wherein said positioning pin has a semi-spherical pin point.

4. The method of manufacturing a resin-sealed semiconductor device according to claim 1,
   wherein a small clearance is produced between said positioning pin inserted into said molds and said lead frame.

5. A method of manufacturing a resin-sealed semiconductor device comprising the steps of:
   disposing a lead frame having a semiconductor chip mounted thereon between an upper mold and a lower mold and sandwiching a part of said lead frame between said upper and lower molds;
   inserting a positioning pin from either said upper or lower mold;
   injecting a resin to push said lead frame in a direction which is opposite to a direction toward which said positioning pin is inserted in said molds;
   sealing said lead frame by hardening said resin while locating said lead frame in position with injection pressure of said resin and said positioning pin; and
   pulling said positioning pin from said molds after said resin hardens.

6. The method of manufacturing a resin-sealed semiconductor device according to claim 5,
   wherein said positioning pin has a sharp pin point.

7. The method of manufacturing a resin-sealed semiconductor device according to claim 5,
   wherein said positioning pin has a semi-spherical pin point.

8. The method of manufacturing a resin-sealed semiconductor device according to claim 5,
   wherein a small clearance is produced between said positioning pin inserted into said molds and said lead frame.

9. The method of manufacturing a resin-sealed semiconductor device according to claim 5,
   wherein a bending processing is applied to said lead frame so as to allow said lead frame to efficiently receive the injection pressure of said injected resin.

10. A method of manufacturing a resin-sealed semiconductor device comprising the steps of:
    locating a lead frame having a semiconductor chip mounted thereon between an upper mold and a lower mold and sandwiching a part of said lead frame between said upper and lower molds;
    locating said lead frame in position by inserting a positioning pin having a reduced cross section, the reduced cross section being inserted in the molds;
    pushing the lead frame against the positioning pin and sealing said lead frame by injecting a resin into said molds and completely hardening said resin while keeping said positioning pin in said molds; and
    removing said pins from said resin and molds after said resin completely hardens.

11. The method of manufacturing a resin-sealed semiconductor device according to claim 10;
    wherein said reduced cross section is a sharp pin point.

12. The method of manufacturing a resin-sealed semiconductor device according to claim 10;
    wherein said reduced cross-section is a semi-spherical pin point.

13. The method of manufacturing a resin-sealed semiconductor device according to claim 10,
    wherein a small clearance is produced between said positioning pin inserted into said molds and said lead frame.

14. A method of manufacturing a resin-sealed semiconductor device comprising the steps of:
    locating a lead frame having a semiconductor chip mounted thereon between an upper mold and a lower mold and sandwiching a part of said lead frame between said upper and lower molds;
    inserting a positioning pin from either said upper or lower mold;
    injecting a resin to push said lead frame in a direction which is opposite to a direction toward which said positioning pin is inserted in said molds;

sealing said lead frame by completely hardening said resin while locating said lead frame in position with injection pressure of said resin and said positioning pin; and removing said pin from said resin and mold after said resin completely hardens.

15. The method of manufacturing a resin sealed semiconductor device according to claim 14, wherein said pin is inserted only from said upper mold.

16. The method of manufacturing a resin-sealed semiconductor device according to claim 14, wherein said pin is inserted only from said lower mold.

17. The method of manufacturing a resin-resealed semiconductor device according to claim 14, wherein said positioning pin has a sharp pin point at an end that is located in the mold.

18. The method of manufacturing a resin-sealed semiconductor device according to claim 14, wherein said positioning pin has a semi-spherical pin point at an end that is located in the mold.

19. The method of manufacturing a resin-sealed semiconductor device according to claim 14, wherein a small clearance is produced between said positioning pin inserted into said molds and said lead frame.

20. The method of manufacturing a resin-sealed semiconductor device according to claim 14, wherein a bending processing is applied to said lead frame so as to allow said lead frame to efficiently receive the injection pressure of said injected resin.

* * * * *